United States Patent [19]

Thompson

[11] Patent Number: 4,933,980

[45] Date of Patent: Jun. 12, 1990

[54] SOUND EFFECTS GENERATOR

[75] Inventor: Michael W. Thompson, Aberdeen, Md.

[73] Assignee: The United States of America as represented by the Secretary of the Army, Washington, D.C.

[21] Appl. No.: 348,739

[22] Filed: May 1, 1989

[51] Int. Cl.[5] .............................................. H03G 3/00

[52] U.S. Cl. .................................................... 381/61

[58] Field of Search ...................... 381/61, 63; 84/1.24, 84/645, 653

[56] References Cited

U.S. PATENT DOCUMENTS 4,437,377 3/1984 Mitarai et al. ........................ 84/1.24

4,628,789 12/1986 Fujimori ............................... 381/61

4,643,066 2/1987 Oya ..................................... 84/1.24

4,685,134 8/1987 Wine .................................... 84/1.24

OTHER PUBLICATIONS

Microelectronics Data Catalog (1982), General Instruments Corporation, "Programmable Sound Generator", pp. 5-18 through 5-25.

*Primary Examiner*—Forester W. Isen

*Attorney, Agent, or Firm*—Saul Elbaum

[57] ABSTRACT

A sound effects generator including a pair of digitally programmable sound generators, each of which is independently and dynamically controlled by a programmed digital signal processor through a control logic interface. Each programmable sound generator includes three intermediate signal channels providing respective digital noise and tone signals. Each intermediate signal channel, moreover, includes a mixer for blending the respective noise and tone signals as desired. Each intermediate channel output is also individually shaped or modulated by one of a plurality of distinct waveforms which digitally control the amplitude period and/or frequency thus generating an envelope of noise and/or sound to produce a particular sound or audible effect which is then converted to an analog output. The three analog outputs of the intermediate signal channels of the two sound generators are then respectively mixed to provide two separate composite analog outputs of sound which can be dynamically altered separately through control of a signal processor comprised of a digital microprocessor or microcomputer.

13 Claims, 3 Drawing Sheets

SOUND EFFECTS GENERATOR

ORIGIN OF THE INVENTION

This invention was made by an employee of the U.S. Government. Accordingly, the Government may practice the invention without the payment of any royalties thereon or therefor.

BACKGROUND OF THE INVENTION

1. Field of the Invention

This invention relates generally to sound effects generators and more particularly to a digital sound effects generator which operates to produce a wide variety of sounds under program control of a digital signal processor.

Sound effects generators are generally known and are desirable in certain environments in that sound adds another dimension to the sensory information available to subjects involved in real time simulation and/or experiments due to the fact that there is imparted a sense of realism to the tasks being performed.

In real time simulations and experimentation, time, or more specifically the amount of time required to perform a task, is of paramount importance when many different applications must be run simultaneously. The ability to simulate as closely as possible actual operating conditions is extremely helpful when evaluating human response to various stimuli. Flight simulators used to train flight crews for particular aircraft including not only airplanes, but also helicopters, comprise extremely complex equipment that provide sight, sound and feel inputs to the personnel being trained.

2. SUMMARY

It is an object of the present invention, therefore, to provide an improvement in sound effects generators.

It is a further object of the invention to provide a sound effects generator capable of digitally synthesizing a wide variety of complex sounds.

It is still another object of the invention is to provide a digital sound effects generator which permits a plurality of digitally generated noises and tones to be mixed and shaped for producing a single complex sound of multiple elements of noise and tones.

It is yet another object of the invention to provide a sound effects generator for generating sounds under control of a digital signal processor.

And yet another object of the invention is to provide a sound effects generator for digitally generating aircraft engine sounds and cockpit noises under program control of a digital signal processor as well as dynamically altering the sounds on demand.

Briefly, the foregoing and other objects of the invention are provided by a pair of programmable sound generators, each of which is independently and dynamically controlled by a programmed digital signal processor through a control logic interface. Each programmable sound generator includes three intermediate signal channels providing respective digital noise and tone signals. Each intermediate signal channel, moreover, includes a mixer for blending the respective noise and tone signals as desired. Each intermediate channel output is also individually shaped or modulated by one of a plurality of distinct waveforms which digitally control the amplitude period and/or frequency thus generating an envelope of noise and/or sound to produce a particular sound or audible effect which is then converted to an analog output. The three analog outputs of the intermediate signal channels of the two sound generators are then respectively mixed to provide two separate composite analog outputs of sound which can be dynamically altered separately through control of a signal processor comprised of a digital microprocessor or microcomputer.

BRIEF DESCRIPTION OF THE DRAWINGS

The subject invention will be better understood when the following detailed description is considered in conjunction with the accompanying drawing in which.

DETAILED DESCRIPTION OF THE INVENTION

Figure 1:
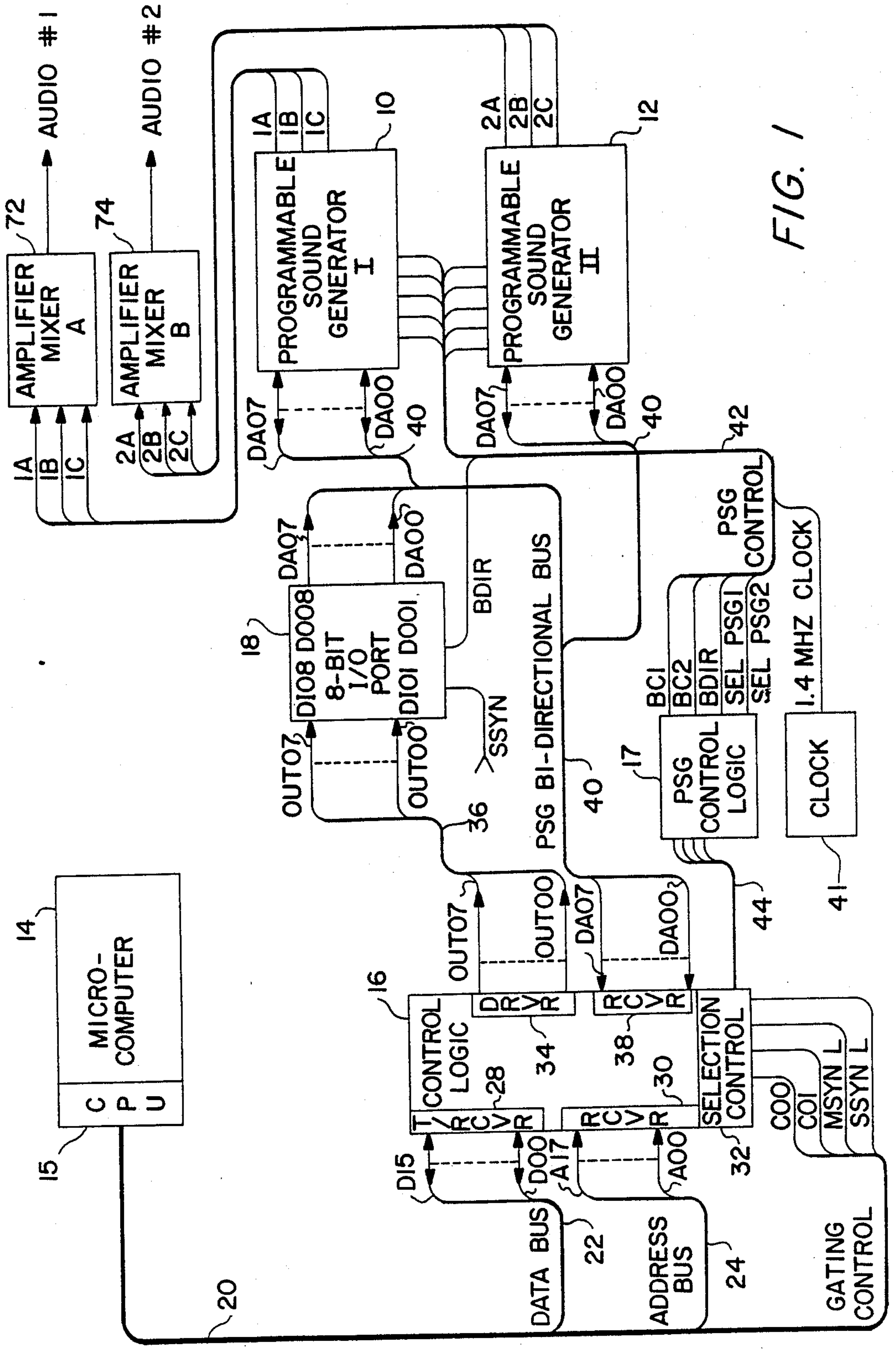
FIG. 1 is an electrical block diagram illustrative of the preferred embodiment of the invention.

Referring now to the drawings and more particularly to FIG. 1, the sound effects generator is comprised of a pair of identical digitally programmable sound generators 10 and 12 which are controlled by the software of a digital signal processor 14 which may be comprised of a microprocessor or a microcomputer having a central processing unit (CPU) 15 and which is coupled thereto through a digital logic interface unit 16.

The programmable sound generators 10 and 12 comprise well known register oriented digital devices capable of producing a wide variety of sounds under software control. A typical example of the sound generators comPrises the programmable sound generators manufactured by the General Instrument Corporation under part No. AY-3-8912. The details of such devices are set forth in the publication of General Instruments Corporation entitled, Microelectronics Data Catalog, (1982) "Programmable Sound Generator" at pp. 5–18 through 5–25. The architecture of these devices is based on the concept of memory-map input/output with control commands being issued thereto by writing to sixteen memory-mapped registers, each of which is readable so that a microcomputer, for example, can determine as necessary present states or stored data values.

Figure 2:
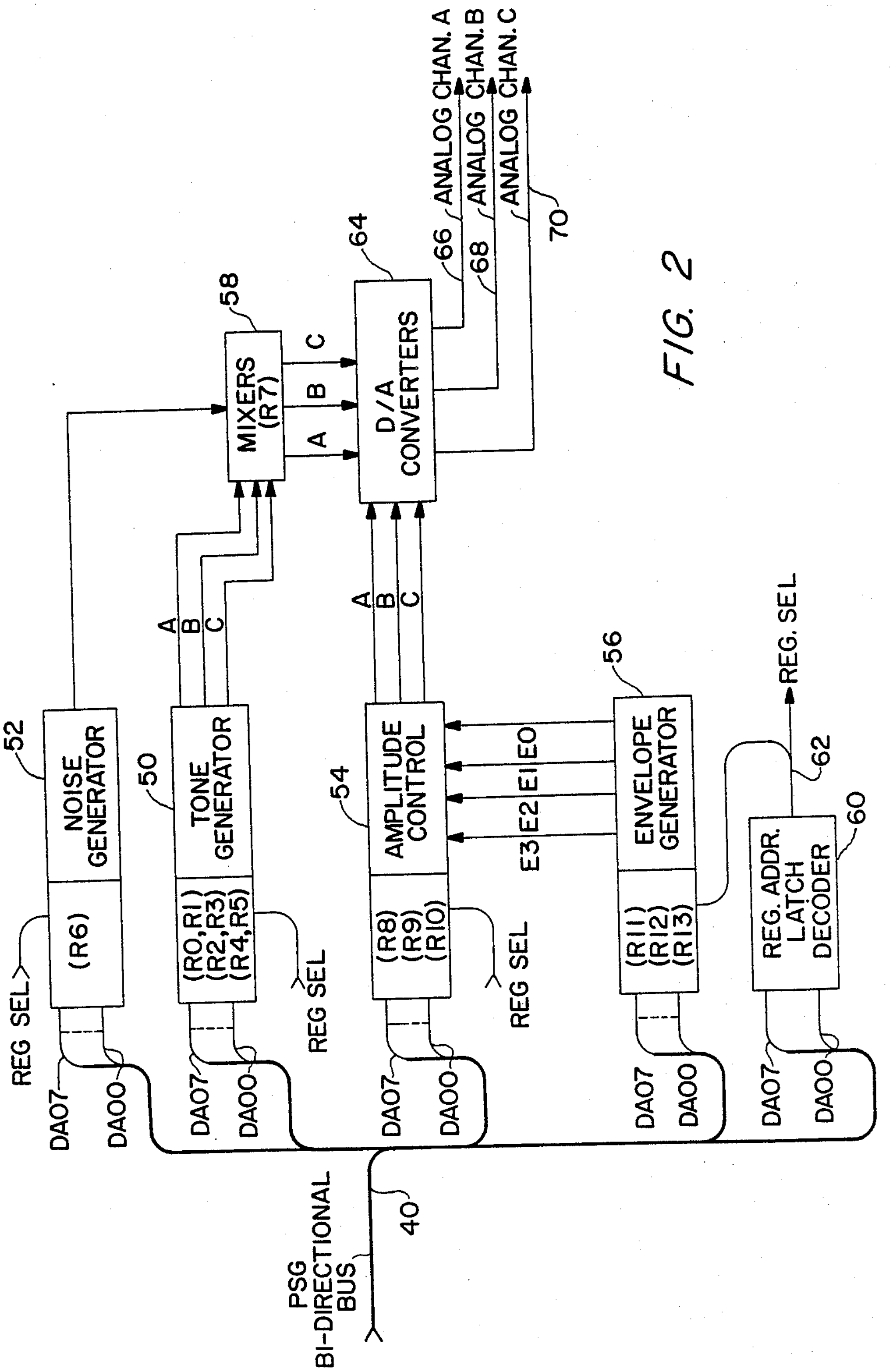
FIG. 2 is an electrical block diagram illustrative of the programmable sound generators shown in FIG. 1.

All functions of the programmable sound generators 10 and 12 are controlled through sixteen registers which are broadly disclosed in FIG. 2, so that once programmed, they generate and sustain predetermined sounds, thus freeing the system processor, i.e., the microcomputer 14 for other tasks.

The interface between the microcomputer 14 and the two sound generators 10 and 12 comprises apparatus utilized in connection with a digital sound processor having a "Unibus" architecture. "Unibus" is a registered trademark of the Digital Equipment Corporation. The interface as shown in FIG. 1 includes a bus control logic unit 16, a sound generator control logic unit 17, and an 8-bit input/output port 18 which allows the programmable sound generators 10 and 12 to communicate with the computer 14 and vice versa. The bus control logic unit 16 couples to the CPU 15 of the microprocessor 14 via a multi-line bidirectional bus 20 which includes a data signal bus 22 comprised of sixteen bidirectional data lines D00 . . . Dl5, an address signal bus 24 comprised of eighteen signal lines A00 . . . Al7, and a gating control signal bus 26 comprised of four control lines Coo, C0l, MSYN-L, and SSYN-L.

The data bus 22 is a bidirectional SEND or RECEIVE bus coupled to a data transmitter/receiver portion 28 of the bus control logic unit 16. The information to be transmitted to either sound generator 10 or 12 or received therefrom is placed on the bus 20. The direction of information flow depends upon whether a READ or WRITE operation is being performed by the CPU 15 of the microcomputer 14. The address bus 24 is coupled to one receiver portion 30 of the bus control logic unit 16 and is used to individually address the sound generators 10 and 12. If the programmable sound generator address received by either sound generator 10 and 12 corresponds to the address specified, it responds with the appropriate return signals, informing the microcomputer 14 that it is ready for operation. The gating control bus 26 is coupled to the selection control portion 32 of the control logic 16 which in turn is coupled to sound generator control logic unit 17 for determining the type of operation, READ or WRITE, that will be performed by the particular sound generator 10 or 12.

The control logic unit 16 additionally includes an octal driver 34 which is coupled to the sound generators 10 and 12 via the input/output port 18 and an eight-line data bus 36 including the lines numbered OUT00 . . . OUT07 and an octal receiver 38 coupled back from the sound generators 10 and 12 and the input/output port 18 via an eight line bidirectional data bus 40 including the lines numbered DA00 . . . DA07.

Further as shown, the programmable sound generators operate in accordance with a digital clock 41 which couples to the sound generators 10 and 12 by means of the digital bus 42 which also couples to the output of the logic unit 17. The programmable sound generator control logic unit 17 is furthermore connected back to the selection control unit 32 via the digital bus 44.

Referring now to FIG. 2, shown thereat is a block diagram of one of the programmable sound generators 10 and 12, it previously being noted that both the sound generators are identical in construction. Each programmable sound generator is comprised of thirteen read/write registers R0 . . . R6 and R8 . . . R13 which enable it to digitally produce complex sounds on three independent channels A, B, C. The sounds are digitally produced by combining the outputs generated from a tone generator 50, a noise generator 52, an amplitude control block 54, an envelope and period control block 56, and a mixer control block 58.

The tone generator 50 produces square wave tones at user control frequencies for each of the three sound channels A, B and C. Associated with the tone generator 50 are six tone generator control registers R0–R5 which control the output frequencies for the three channels A, B and C. Each channel has two registers associated with it. For example, channel A includes a coarse tune register R1 and a fine tune register R0 while channels B and C include respective coarse tune registers R3 and R5 and fine tune registers R2 and R4. The frequency for each channel is determined by an 8-bit count (0–255) loaded in the fine tune register and a 4-bit count (0–15) loaded in the coarse tune register. The 8-bit fine tune register contains the least significant bits (LSB) and is used for making fine frequency adjustments to the tone. The 4-bit coarse tune register contains the most significant bits (MSB) and is used for making coarse frequency adjustments to the tone. Combined, the pair of registers for each channel produce a 12-bit value used to divide a basic clock frequency, for example 1.4 MHz from the clock 41, by the value contained in the corresponding registers for each channel. The noise generator 52 produces a frequency modulated pseudo-random pulsewidth square wave and includes a single noise generator control register R6. The noise frequency component is determined by a 5-bit value (range 0–31) loaded into the register R6 and is derived by dividing the basic clock frequency (1.4 MHz) by the value loaded in register R6. Since there is only one noise generator control register, the noise frequency component on each channel will be the same for all three channels.

The mixer 58 comprises a single control register R7 and controls the combining of the tone and noise outputs from the tone generator 50 and noise generator 52 for each of the three analog output channels A, B and C. The mixer 58 combines either, neither, or both digital tone and noise signals for each channel. The mixing is determined by the 6-bit value (range 0–63) loaded in the register R7. Bit 0, bit 1 and bit 2 designate which of the channels A, B and C are enabled/disabled for tone, whereas bit 3, bit 4 and bit 5 designate which channels are enabled/disabled for noise. To enable a particular channel simply requires the appropriate bits to be reset.

With respect to the amplitude control block 54, it includes three 5-bit amplitude control registers R8, R9 and R10. These registers control the amplitude level and select the mode for each output channel A, B and C. Bit 4 in each amplitude control register designates whether the amplitude will be fixed or if the amplitude will be modulated. When the mode is fixed, bits 0–3 provide 16 (0–15) discrete volume levels with 0 being the lowest level corresponding to "Off" and 15 being the highest level. In the "modulated" mode, the volume is controlled according to the shape and frequency produced by the envelope generator 56.

The envelope generator block 56 is a control section that makes it possible to vary the envelope period or frequency as well as select or change the envelope shape when modulating the output of channels A, B and C with the amplitude control block 54. Two 8-bit envelope control registers comprising registers R14 and R15 control the period of frequency of the selected envelope pattern. The register R14 is the envelope fine tune register and represents the LSB and provides the envelope period for fine tuning adjustments. The envelope coarse tune register R15 represents the MSB and provides the envelope period coarse tuning adjustments. Internally combined, the resulting 16-bit value is used to divide the fundamental clock frequency and derive the envelope period or frequency.

A single 4-bit envelope shape/cycle control register R13 determines the envelope shape and cycle. Bits 0–3 are used to produce any one of 10 envelope shapes which include combinations of various ramps and sawtooth waveforms. Each bit has a specific control function in the envelope generator which causes one of the envelope shapes to be produced.

Each of the registers R0 . . . R13 are addressed from a registered address latch decoder 60 which is coupled to the bidirectional data bus 40 and produces an output on line 62 to select a particular register in accordance with the required function.

Additionally, each programmable sound generator includes a digital to analog conversion section 64 for transforming the digital data, as represented by the various registers R0 ... R13 into an analog sound outputs where three separate analog channels of sound are generated on signal lines 66, 68 and 70. Each channel output is independently controlled and may contain a noise component and/or tone component as determined by the register data.

Returning now to FIG. 1, the execution of a data transfer instruction from the CPU 15 of the signal processor 14 causes the appropriate address bits A00 through A17 and the control bits C0 and C01 to be respectively placed on the address bus portion 24 and the gating control portion 26 of the CPU bus 20. Each of the sound generators 10 and 12 receive the address and control bits and begins the device address decoding. After a short interval delay, each of the devices 10 and 12 completes its address decoding whereupon the sound generator with the proper address resPonds back to the CPU 15 that it is enabled.

Data is transferred from the CPU to the selected sound generator by way of the data lines D00 through D15 of the data bus 22 and the output lines OUT07 through OUT00 of the bus 36 coupled to the input-output port 18. These signals in turn are passed from the input-output port 18 to the bidirectional bus 40, where the data is then available for processing by the selected programmable sound generator for either register selection or data transferred to the selected register.

The three analog signals for channels A, B and C from both programmable sound generators 10 and 12 are next fed to respective amplifier mixer circuits 72 and 74 to produce two separate composite analog output signals.

Figure 3:
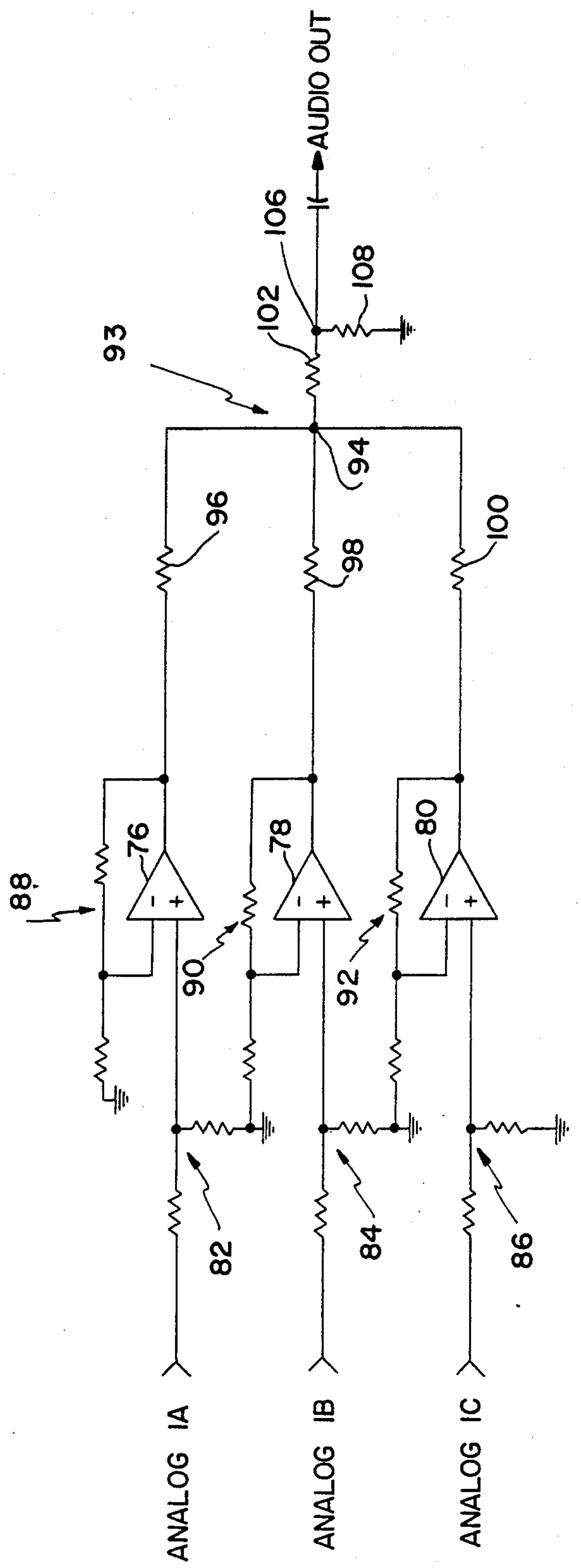
FIG. 3 is an electrical schematic diagram illustrative of one of the amplifier mixers shown in FIG. 1.

Referring now to FIG. 3, each of the mixer-amplifier circuits 72 and 74 include three operational amplifiers 76, 78 and 80 whose respective (+) inputs receive the analog signals for channels A, B and C through respective resistance tyPe voltage dividers 82, 84 and 86. The (−) inputs of the three operational amplifiers 76, 78 and 80 are coupled to their respective outputs via resistance type voltage dividers 88, 90 and 92. The outputs of the three operational amplifiers 76, 78 and 80, moreover, are coupled to a resistive summing network 93 including a summing junction 94 which comprises the common connection of resistors 96, 98, 100 and 102. The output comprises a signal at circuit node 106 which comprises the common connection between summing resistor 102 and a resistor 108 coupled to ground.

Thus what has been shown and described is a digitally controlled sound effects generator including a pair of programmable sound generators, each producing three channels of sound and noise which can be selectively mixed to provide two final analog audio outputs. Being a register oriented device, the subject invention is particularly useful for real time applications requiring relatively little computer processing time to generate and alter sounds on demand. Application programming can be accomplished using FORTRAN callable subroutines which initialize and alter the desired sounds.

Having thus shown and described what is at present considered to be the preferred embodiment of the invention, it should be noted that alterations, modifications and changes coming within the spirit and scope of the invention are herein meant to be included.

I claim:

1. A sound effects generator, comprising:

a digital signal processor;

at least one programmable sound generator including means for digitally generating a plurality of complex sound signals under the control of said digital signal processor and including means for converting said sound signals to analog sound signals;

a control logic interface coupling and providing communication between said at least one sound generator and said digital signal processor, said logic interface further including:, a bus control logic unit, a sound generator control logic unit, a clock signal generator, and an input-/output port, a first digital signal bus couple between said digital signal processor and said bus control logic unit, a second digital signal bus coupled between said bus control logic unit and said input/output port, a third digital signal bus coupled between said bus control logic unit, said input/output port and sadi sound generator, a fourth digital signal bus coupled between said bus control logic unit and said sound generator control logic unit, and a fifth digital signal bus coupled between said sound generator control logic unit, said clock signal generator, said input/output port and said sound generator; and signal mixer means coupled to said at least one sound generator and being responsive to said plurality of analog sound signals for generating a composite analog sound signal output therefrom.

2. The sound effects generator as defined by claim 1 wherein said at least one sound generator comprises a pair of programmable sound generators.

3. The sound effects generator as defined by claim 1 wherein said first and third digital signal bus, at least, comprises a bidirectional digital signal bus.

4. The sound effects generator as defined by claim 1 wherein said first digital signal bus comprises a bidirectional signal bus having a plurality of data bus gating control lines.

5. The sound effects generator as defined by claim 4 wherein sadi data bus control logic unit includes:

a data transmit/receiver portion coupled to said data bus lines, an address receiver portion coupled to said address bus lines, and a selector control logic portion coupled to said gating control lines.

6. The sound effects generator as defined by claim 5 wherein said fourth digital signal bus is coupled to said selection control logic portion.

7. The sound effects generator as defined by claim 5 wherein said bus control logic unit further comprises a digital signal driver portion coupled to said second digital signal bus and a digital signal receiver portion coupled to said third digital signal bus.

8. The sound effects generator as defined by claim 1 wherein said at least one programmable sound generator comprises register oriented apparatus operable under program control and including:

a plurality of read/write digital data registers selectively couPled to and controlling a noise generator section, a tone generator section, an amplitude control section, an envelope shaping and period control section, and a mixer control section for generating said plurality of digital sound signals and additionally including a digital to analog converter for converting said plurality of digital sound signals to a respective plurality of analog and sound signals control logic unit and said sound generator control logic unit.

9. The sound effects generator as defined by claim 8 wherein said at least one programmable sound generator comprises a pair of programmable sound generators.

10. The sound effects generator as defined by claim 9 wherein said signal processor comprises a central processing unit of a microprocessor.

11. The sound effects generator as defined by claim 9 wherein said signal processor comprises a central processing unit of a microcomputer.

12. A sound effects generator, comprising:

signal processor means;

controllable sound generator means including means for generating a plurality of sound signals under the control of said signal processor means;

control interface means coupling and providing communication between said sound generator means and said signal processor means, said inteface means further comprising:

signal path control means, sound generator control means, a control signal generator means, and a signal coupler means, first circuit means coupling said signal processor means and said signal path control means, second circuit means coupling said signal path control means and said signal coupler means, third circuit means coupling said signal path control means, said signal coupler means and said sound generator means, fourth circuit means coupling said signal path control means and said sound generator control means;

fifth circuit means coupling said sound generator control means, said control signal generator means, said signal coupler means and said sound generator means; and signal mixer means coupled to said sound generator means and being responsive to said plurality of sound signals for generating a composite sound signal output therefrom.

13. The sound effects generator as defined by claim 12 wherein said sound generator means comprises a pair of controllable sound generators.

* * * * *